(12) United States Patent
Baba et al.

(10) Patent No.: US 7,425,151 B2
(45) Date of Patent: Sep. 16, 2008

(54) CONNECTOR, PRINTED CIRCUIT BOARD, CONNECTING DEVICE CONNECTING THEM, AND METHOD OF TESTING ELECTRONIC PART, USING THEM

(75) Inventors: Masayuki Baba, Kawasaki (JP); Shuichi Kameyama, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 11/657,463

(22) Filed: Jan. 25, 2007

(65) Prior Publication Data

US 2007/0123099 A1 May 31, 2007

Related U.S. Application Data

(63) Continuation of application No. PCT/JP2005/013875, filed on Jul. 28, 2005.

(30) Foreign Application Priority Data

Jul. 28, 2004 (JP) ............................. 2004-219804

(51) Int. Cl.
*H01R 13/60* (2006.01)
(52) U.S. Cl. ...................................... 439/567; 439/357

(58) Field of Classification Search ................ 439/357, 439/567
See application file for complete search history.

(56) References Cited

U.S. PATENT DOCUMENTS 5,529,514 A * 6/1996 Gargiulo ..................... 439/567
7,134,909 B2 11/2006 Baba et al.

FOREIGN PATENT DOCUMENTS

| JP | 1-63082 | 4/1989 |
| JP | 2-68982 | 3/1990 |

* cited by examiner

*Primary Examiner*—Truc T Nguyen
(74) *Attorney, Agent, or Firm*—Kratz, Quintos & Hanson LLP

(57) ABSTRACT

The invention has an object of providing a connector for connecting between a printed circuit board and a test device, capable of easily attaching and detaching the connector at low cost. The connector includes at least one conducting pin 28 that is protruded from a connector body, and at least one fixing pin 30 that is extended substantially in parallel with the conducting pin. The fixing pin 30 is longer than the conducting pin 28.

5 Claims, 9 Drawing Sheets

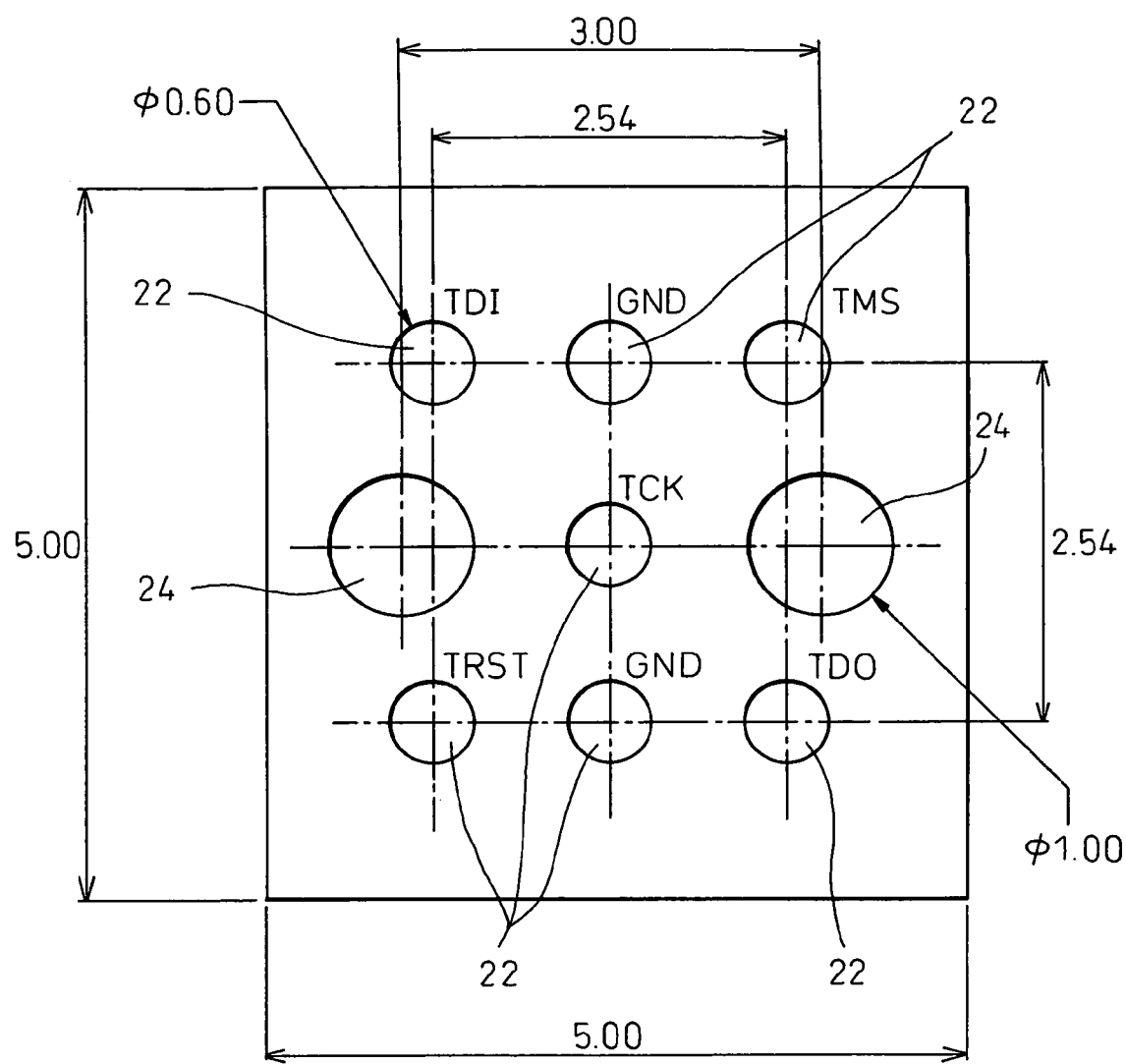

CONNECTOR, PRINTED CIRCUIT BOARD, CONNECTING DEVICE CONNECTING THEM, AND METHOD OF TESTING ELECTRONIC PART, USING THEM

CROSS-REFERENCE TO RELATED APPLICATION

This application is a continuation of PCT/JP2005/013875 filed on Jul. 28, 2005, the contents being incorporated therein by reference.

TECHNICAL FIELD

The present invention relates to a connector, a printed circuit board, a connecting device connecting them, and a test device that tests an electronic part, using them. Particularly, the invention relates to a method of testing an electronic part mounted on a printed circuit board, by connecting a connector attached to a test device, to a test region provided on the printed circuit board, and also relates to a connector, a printed circuit board, and a connecting device that connects them capable of properly performing the testing method.

BACKGROUND OF ART

In testing a printed circuit board, conventionally, plural probes connected to a test device are arranged, in the same pattern as the pattern of electrode pads on the printed circuit board, and are brought into contact with the respective electrode pads. Spring probes are used as testing probes. The spring probes are arranged in a dedicated jig, and are pressed against the electrode pads on the printed circuit board. This method makes it necessary to develop and manufacture jigs in line with printed circuit boards, and the cost of developing and manufacturing a jig arises for each type of printed circuit board. Moreover, the jig that supports the spring probes has a relatively complex structure, and a mechanism for supporting the printed circuit board is also necessary.

As a method of connecting a printed circuit board to a test device, a method of mounting a dedicated connector ion the printed circuit board is available. According to this method, a connector mounting design capable of mounting the connector on the printed circuit board is necessary. Consequently, cost of parts of the connector, and labor and expenses for mounting the connector arise.

A conventional example of a connector attached to a printed circuit board is disclosed in Japanese Unexamined Patent Publication No. 2002-268911. According to this technique, terminal pins of the connector are inserted into through-holes formed on the printed circuit board.

Patent literature 1: Japanese Unexamined Patent Publication No. 2002-268911

DISCLOSURE OF INVENTION

Problems to be Solved by the Invention

It is an object of the present invention to provide a connector that can connect between a test device and a printed circuit board at relatively low cost, a printed circuit board, a connecting device that connects them, and provide a method of testing an electronic part, using them.

It is another object of the present invention to provide a connector, a printed circuit board, and a connecting device that connects them, suitable for a unified standard to realize the JTAG test device prescribed in the IEEE 1149.1, for example.

Means for Solving the Problems

A connector according to the present invention includes plural conducting pins, and at least one fixing pin extending substantially in parallel with the conducting pin. The fixing pin is longer than the conducting pin.

The fixing pin has a structure suitable for being fixed to a printed circuit board. For example, the fixing pin has a tapered structure thinner toward the distal end. Alternatively, the fixing pin includes at least one elastically deformable member, and this member has a hook portion.

Preferably, at least one fixing pin is structured to restrict a direction of mounting the connector. Moreover, the at least one fixing pin preferably includes two fixing pins.

According to the foregoing structure, the fixing pin of the connector is inserted into a fixing hole formed on a printed circuit board. When the connector is pushed against the printed circuit board, the conducting pins of the connector are brought into contact with electrode pads on the printed circuit board. The fixing pins of the connector are engaged with the fixing holes formed in the printed circuit board when being inserted into the fixing holes. Consequently, the connector is electrically connected to the printed circuit board, and is joined to the printed circuit board. In other words, the connector can be autonomously joined to the printed circuit board. Accordingly, the connector can be easily attached to the printed circuit board, and electrically connected to the printed circuit, without using other jig.

The present invention provides a printed circuit board having a test region that can be connected to a connector having at least one fixing pin and plural conducting pins for a testing signal, wherein, in the test region, there are disposed at least one fixing hole into which the fixing pin can be inserted, and plural signal electrodes that can be brought into contact with the conducting pins.

In this case, five signal electrodes are disposed at each apex of a square and at a center position of diagonal lines of the square, respectively. Particularly, the five signal electrodes are electrodes for JTAG testing signals. A signal electrode of TCK is disposed at a center position of the diagonal lines of the square. A signal electrode of TDI and a signal electrode of TDO are disposed at both ends of one diagonal line, respectively of the square. A signal line of TMS and a signal line of TRST are disposed at both ends of the other diagonal line, respectively of the square. When these signal electrodes are disposed in this way, the arrangement of wiring on the printed circuit board connected to these electrodes can be optimized.

Two grounding electrodes are further disposed in the test region, one grounding electrode being disposed at a center position of a first side of the square, and the other grounding electrode being disposed at a center position of a third side of the square opposite to the first side. The signal electrodes or the grounding electrodes are electrode pads.

Two fixing holes are disposed on a straight line between the first side and the third side of the square, at positions separated from the center positions of the diagonal lines in mutually opposite directions, respectively. In this case, when diameters or cross-sectional shapes of the two fixing holes are mutually different, insertion directions of corresponding connectors can be restricted, thereby preventing an erroneous connection.

Further, the present invention provides a connector that can be connected to a test region of a printed circuit board on which at least one fixing hole and plural signal electrodes are disposed, wherein the connector includes a connector body, at least one fixing pin that can be inserted into the fixing hole, and plural signal conducting pins that can be contacted to the signal electrodes, the at least one fixing pin and the plural signal conducting pins being protruded in parallel with each other from the connector body.

In this case, five signal conducting pins are disposed at each apex of a square and at a center position of diagonal lines of the square, respectively. Particularly, the five signal conducting pins are pins for the JTAG testing signals. A signal conducting pin of TCK is disposed at a center position of the diagonal lines of the square. A signal conducting pin of TDI and a signal conducting pin of TDO are disposed at both ends of one diagonal line, respectively of the square. A signal conducting pin of TMS and a signal conducting pin of TRST are disposed at both ends of the other diagonal line, respectively of the square.

Further two grounding conducting pins are protruded in parallel with the signal conducting pins, from the connector body, and the grounding conducting pins are disposed at a center position of the first side of the square, and at a center position of the third side of the square opposite to the first side, respectively. In this case, when the signal conducting pins or the grounding conducting pins are spring pins, these pins can be retractably attached to the connector body with a spring.

Two fixing pins are disposed on a straight line between the first side and the third side of the square, at positions separated from the center positions of the diagonal lines in mutually opposite directions, respectively. In this case, diameters or cross-sectional shapes of the two fixing pins are mutually different. Particularly, it is preferable that one of the two fixing pins has a smaller diameter and a larger length than the diameter and the length, respectively of the other fixing pin.

Further, the present invention provides a connecting device including: a connector having a connector body, and at least one fixing pin and plural conducting pins that are protruded in parallel with each other from the connector body; a printed circuit board having at least one fixing hole into which the fixing pin can be inserted, and a test region in which plural electrodes that can be contacted to the conducting pins are disposed; and a mechanism for positioning and fixing the connector to the printed circuit board to keep the conducting pins contacted to the electrodes in a state that the fixing pins are inserted into the fixing holes.

In this case, the conducting pins provided in the connector include five signal conducting pins that are disposed at each apex of a square and at a center position of diagonal lines of the square, respectively, and the electrodes provided on the printed circuit board include five signal electrodes disposed at each apex of a square and at a center position of diagonal lines of the square, respectively, the five signal conducting pins being able to be brought into contact with the five signal electrodes, respectively. Particularly, the five sets of the signal conducting pins and the electrodes provided on the connector and the printed circuit board, respectively are sets of pins and electrodes for the JTAG testing signals. Each set of a signal conducting pin and a signal electrode are: TCK disposed at the center position of the diagonal lines of the square; TDI disposed at one end of one diagonal line; TDO disposed at the other end of the one diagonal line; TMS disposed at one end of the other diagonal line; and TRST disposed at the other end of the other diagonal line.

The connector further has two grounding conducting pins that are protruded in parallel with the signal conducting pins, from the connector body, and the printed circuit board further has grounding electrodes that can be contacted to the two grounding conducting pins. These two sets of grounding conducting pins and electrodes are disposed at the center position of the first side of the square and at the center position of the third side of the square opposite to the first side, respectively.

Both or either one of the signal electrode and the grounding electrode is an electrode pad, and both or either one of the signal conducting pin and the grounding conducting pin is a spring pin retractably attached to the connector body with a spring. These conducting pins are pushed against the electrode pads with spring force. The connector has two fixing pins that are protruded in parallel with the signal conducting pins, from the connector body, and the printed circuit board has two fixing holes into which the fixing pins can be inserted. These two sets of fixing pins and fixing holes are disposed on a straight line between the first side and the third side of the square, at positions separated from the TCK signal conducting pin in mutually opposite directions.

Diameters or cross-sectional shapes of the two sets of fixing pins and fixing holes are mutually different.

Further, the present invention provides a method of testing an electronic part mounted on a printed circuit board, the method including inserting a fixing pin of a connector into a fixing hole provided in a test region on the printed circuit board, bringing plural conducting pins of the connector into contact with plural electrodes, respectively that are electrically connected to the electronic part and are disposed in the test region, and positioning and fixing the connector to the printed circuit board so as to maintain a contact state between the conducting pins and the electrodes.

Five signal conducting pins that are provided in the connector and are disposed at each apex of a square and at a center position of diagonal lines of the square, respectively are brought into contact with five signal electrodes, respectively that are provided in the test region on the printed circuit board and are disposed at each apex of a square and at a center position of diagonal lines of the square, respectively. Particularly, the five sets of signal conducting pins and electrodes provided on the connector and the printed circuit board, respectively are sets of pins and electrodes for the JTAG testing signals. Each set of a signal conducting pin and a signal electrode are TCK disposed at the center position of the diagonal lines of the square; on the other hand, TDI disposed at one end of one diagonal line, and TDO disposed at the other end of the one diagonal line; TMS disposed at one end of the other diagonal line, and TRST disposed at the other end of the other diagonal line. These pairs of pins and electrodes are brought into contact with each other.

The connector further has two grounding conducting pins, and the printed circuit board further has grounding electrodes that can be contacted to the two grounding conducting pins. These two sets of grounding conducting pins and electrodes are disposed at the center position of the first side of the square and at the center position of the third side of the square opposite to the first side, respectively. At the time of connecting the connector, these pairs of grounding conducting pins and electrodes are simultaneously brought into contact with the corresponding pairs of signal conducting pins and electrodes, respectively. In this case, both or either one of the signal electrode and the grounding electrode is an electrode pad, and both or either one of the signal conducting pin and the grounding conducting pin is a spring pin retractable with a spring. At the time of connecting the connector, both or either one of the signal conducting pin and the grounding conducting pin is pressed against the electrode pad with spring force.

The connector has two fixing pins. A distal end of at least one of the two fixing pins is tapered, and has a hook portion. The printed circuit board has two fixing holes into which the fixing pins can be inserted. At least one of the two fixing holes is a through-hole. At the time of connecting the connector, the hook portion of the fixing pin is locked with the back side of the through-hole, thereby positioning and fixing the connector to the printed circuit board.

The connector has two fixing pins, and the printed circuit board has two fixing holes into which the fixing pins can be inserted. Diameters or cross-sectional shapes of the two sets of fixing pins and fixing holes are mutually different, thereby restricting a direction of connecting the connector to the printed circuit board. Particularly, one of the two fixing pins has a smaller diameter and a larger length than the diameter and the length, respectively of the other fixing pin. The one of the pins is inserted into the corresponding fixing hole, and the other fixing pin is inserted into the corresponding fixing hole.

Effect of the Invention

According to the present invention, a connector can be electrically connected to a printed circuit board relatively easily and securely, by bringing a conducting pin at the connector side into contact with an electrode at the printed circuit board side. Further, based on the engagement between a fixing pin and a fixing hole, a state that the conducting pin is electrically connected to the electrode can be secured. When the connector is connected to a test device, an electronic part mounted on the printed circuit board can be tested, by connecting the test device to the printed circuit board at relatively low cost.

BRIEF DESCRIPTION OF THE DRAWINGS

FIG. 19 shows an example of a layout of electrode pads suitable for a unified standard to realize the JTAG test.

Figure 1:
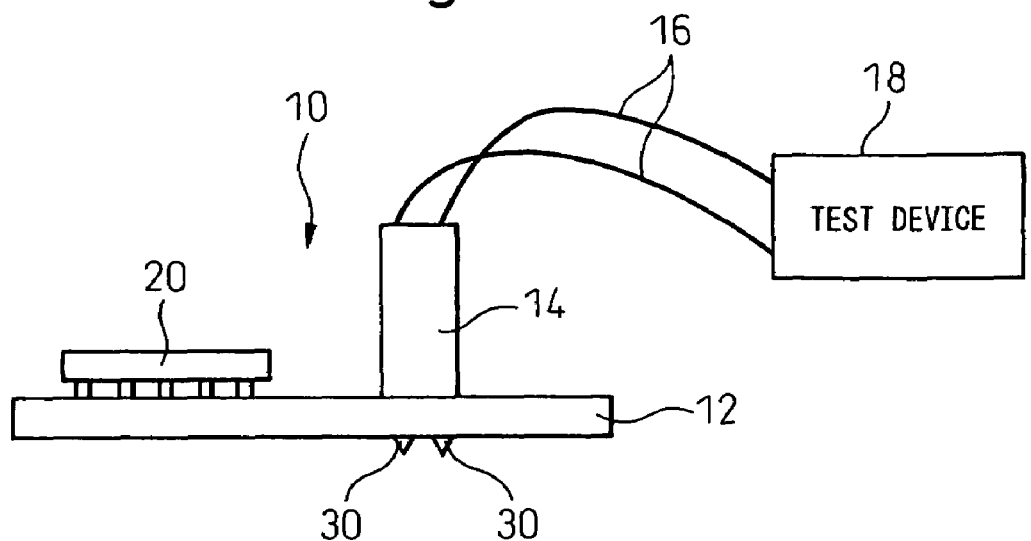
FIG. 1 is a view showing an example in which a connector according to an embodiment of the present invention is connected to a printed circuit board and a test device.

EXPLANATION OF REFERENCE NUMERALS 10 an attachment structure
12 a printed circuit board
14 a connector
16 a cable
18 a test device
20 a semiconductor element
22 an electrode pad
24 a fixing hole
26 a connector body
28 a conducting pin
30 a fixing pin
32 a metallic cylindrical member
34 a contact member
36 a spring
38 a conductive film

BEST MODE FOR CARRYING OUT THE INVENTION

Figure 2:
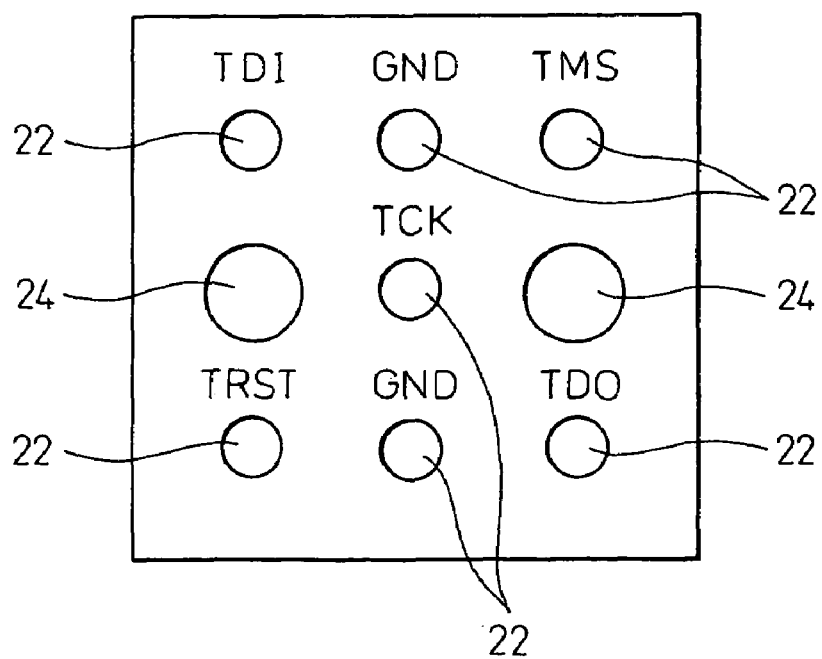
FIG. 2 is a view showing a region in which plural electrode pads and plural fixing holes are arranged on a part of the printed circuit board shown in FIG. 1.

An embodiment of the present invention is explained below with reference to the drawings. FIG. 1 is a view showing an example in which a connector according to the embodiment of the present invention is connected to a printed circuit board and a test device. FIG. 2 is a view showing a test region in which plural electrode pads and plural fixing holes are arranged on a part of the printed circuit board shown in FIG. 1. The test region shown in FIG. 2 is equivalent to a region to which the connector shown in FIG. 1 is attached. A description is made below, by way of an example, of an electric connection between an object to be tested and a test device, for in-circuit emulation of a printed circuit board. However, the present invention is not limit to such an example.

In FIGS. 1 and 2, an attached/assembled structure 10 includes a printed circuit board 12, and a connector 14. The connector 14 is constructed to be attached to the printed circuit board 12, and to be detached from the printed circuit board 12. The connector 14 is connected to a test device 18 by cables 16.

The printed circuit board 12 includes a semiconductor device 20, at least one electrode pad (land) 22, and at least one fixing hole 24. In the illustrated example, plural (for example, five) electrode pads 22 and plural (for example, two) fixing holes 24 are provided. The fixing holes 24 are through-holes. The printed circuit board 12 has internal circuits and external connection terminals that are not shown. The semiconductor element 20 is connected to the electrode pads 22 via the internal circuits. Other electrical components can be mounted on the printed circuit board 12.

The plural electrode pads 22 are provided according to signals prescribed by the IEEE 1149.1 test bus (called a JTAG bus). JTAG (Joint Test Action Group) testing signals include signals TDI, TDO, TMS, TCK, and TRST. TDI is used for a test data input signal, TDO is used for a test data output signal, TMS is used for a test mode select signal, TCK is used for a clock signal, and TRST is used for a reset signal. The electrode pads 22 and the fixing holes 24 are collectively arranged in one region. Preferably, the number of the electrode pads 22 is five or more. Further, a grounding (GND) electrode pad 22 is preferably included.

In FIG. 2, two fixing holes 24 and seven electrode pads 22 are arranged in three columns and three rows. Regarding a row or a column where the fixing hole 24 is positioned, at least one fixing hole 24 and at least one electrode pad 22 are aligned in one straight line in one region.

Figure 3:
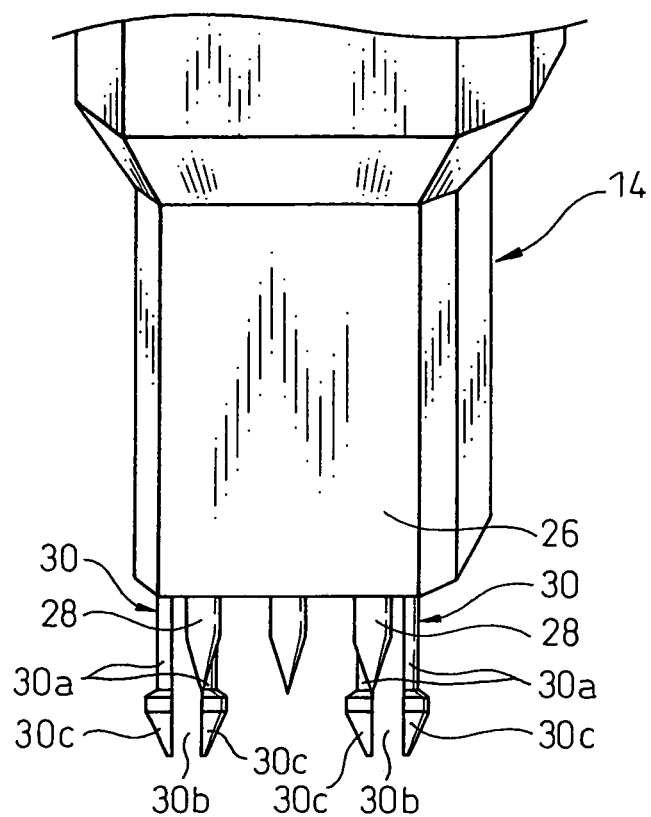
FIG. 3 is a perspective view of the connector.
Figure 4:
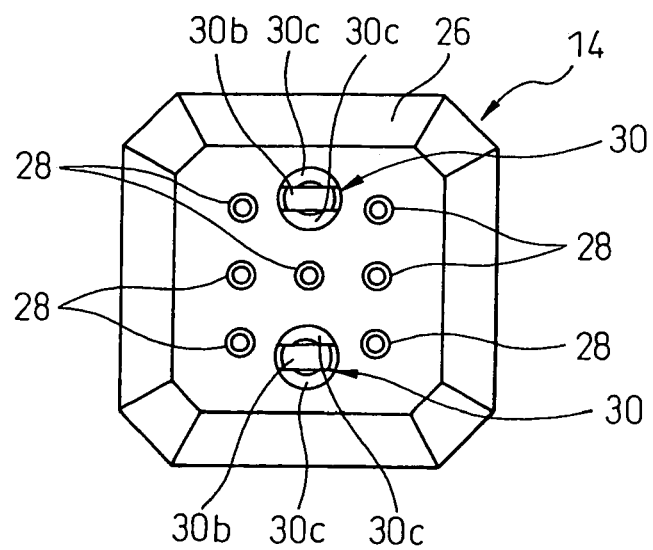
FIG. 4 is a bottom view of the connector shown in FIG. 3.

FIG. 3 is a perspective view of the connector 14, and FIG. 4 is a bottom view of the connector shown in FIG. 3. The connector 14 includes a connector body 26, seven conducting pins 28 projecting downward from the bottom of the connector body 26, and two fixing pins 30 extending substantially in parallel with the conducting pins 28. The fixing pins 30 are longer than the conducting pins 28. The conducting pins 28 are brought into contact with the electrode pads 22 on the printed circuit board 12, and function as probes for testing. Furthermore, the cables 16 shown in FIG. 1 extend from the top of the connector 14. The conducting pins 28 are electrically connected to the cables 16.

The seven conducting pins 28 and the two fixing pins 30 are collectively arranged in one region, in a similar manner to that of the seven electrode pads 22 and the two fixing pins 24 shown in FIG. 2, at positions corresponding to the electrode pads 22 and the fixing holes 24, respectively. When the connector 14 is attached to the printed circuit board 12, the two fixing pins 30 are inserted into the two fixing holes 24, and the seven conducting pins 28 are brought into contact with the seven electrode pads 22. The fixing pins 30 are longer than the conducting pins 28. The fixing pins 30 are inserted into the fixing holes 24 before the conducting pins 28 are contacted to the electrode pads 22. The fixing pins 30 serve as guides for attaching the connector 14 to the printed circuit board 12.

Each fixing pin 30 has a structure suitable for being fixed to the printed circuit board 12. Each fixing pin 30 includes at least one elastically deformable member that can be structured to have a hook portion. In the illustrated example, the distal end of each fixing pin 30 has a split structure. The fixing pin 30 is formed with a pair of elongated members 30a that are elastically deformable to move toward and away from each other. A gap 30b is formed between the pair of the elongated members 30a. When the elongated members 30 are elastically deformed toward and away from each other, the gap 30b gets smaller or larger. Each elongated member 30a has a substantially semicircular cross section. Each elongated member 30a has an arrowhead-like hook portion 30c at a distal end thereof.

Figure 5:
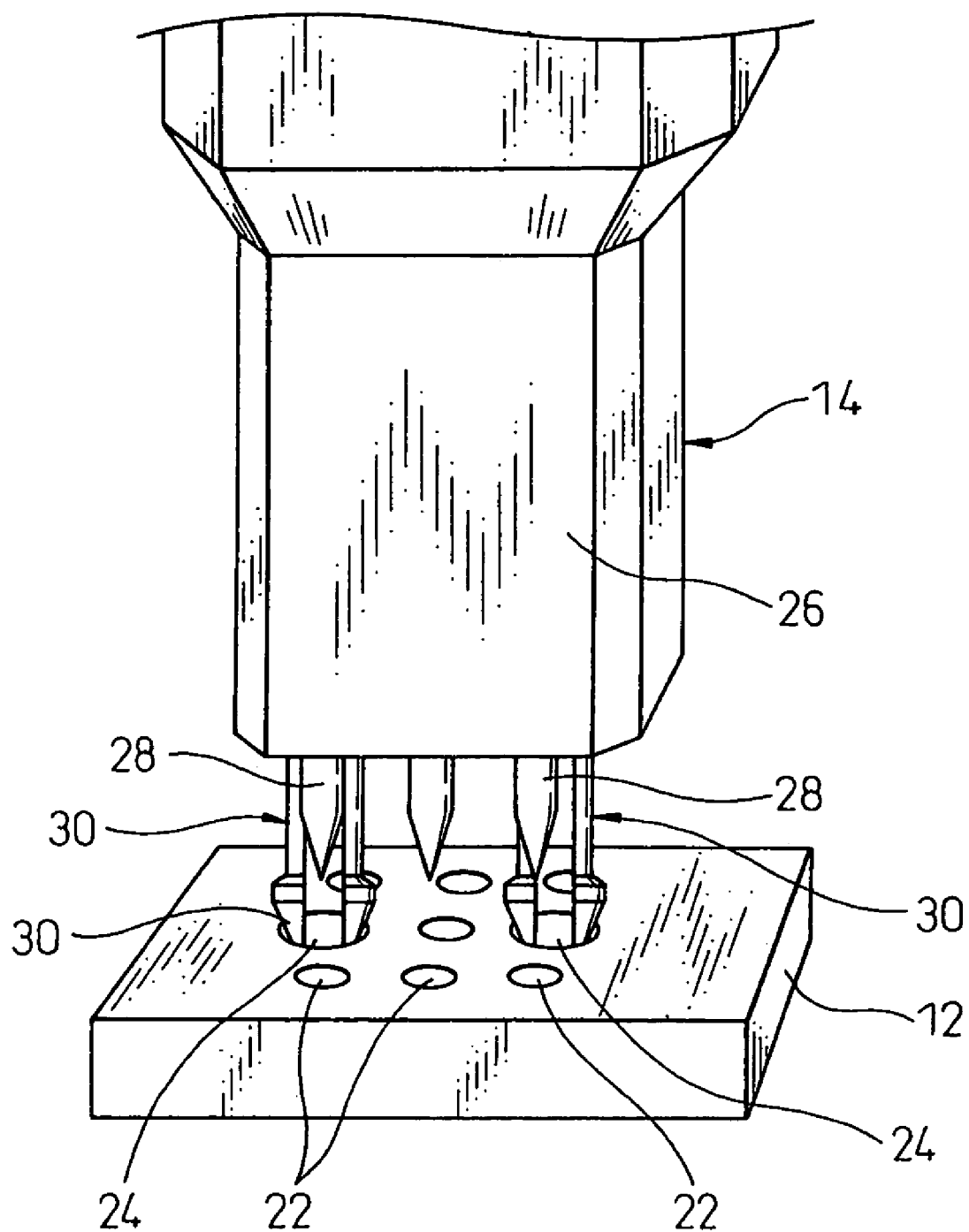
FIG. 5 is a perspective view of the connector showing an initial state of attachment of the connector to the printed circuit board.
Figure 6:
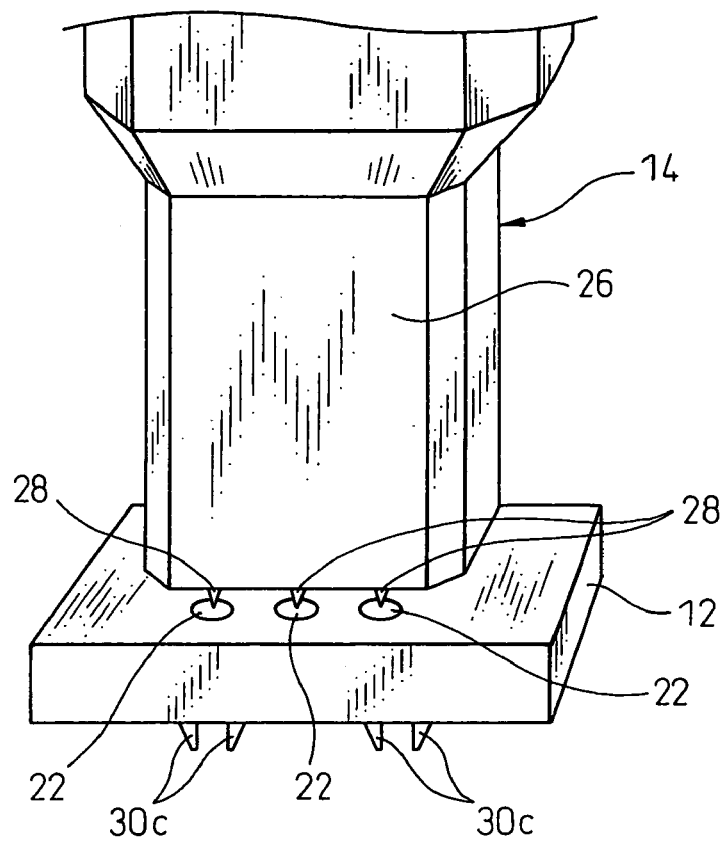
FIG. 6 is a perspective view of the connector showing a state that the connector is attached to the printed circuit board.

FIG. 5 is a perspective view of the connector 14 showing an initial state of attachment of the connector 14 to the printed circuit board 12. FIG. 6 is a perspective view of the connector 14 showing a state that the connector 14 is attached to the printed circuit board 12. In attaching the connector 14 to the printed circuit board 12, the fixing pins 30 of the connector 14 are inserted into the fixing holes 24 on the printed circuit board 12, and the connector 14 is pressed against the printed circuit board 12. As a result, the conducting pins 28 of the connector 14 are brought into contact with the electrode pads on the printed circuit board 12.

A distance between the external surfaces of each of the pair of elongated members 30a of the fixing pin 30 is larger than the inner diameter of each fixing hole 24 on the printed circuit board 12. The lower tapered parts of the distal hook portions 30c of the pair of elongated members 30a are first inserted into the fixing holes 24, respectively. When each fixing pin 30 is pushed into the fixing hole 24, the gap 30b between the pair of elongated members 30a becomes smaller. Once the hook portions 30c pass through the lower edge of the fixing hole 24 (i.e., the bottom surface of the printed circuit board 12), the pair of elongated members 30a are opened. Accordingly, the elongated members 30a are brought into contact with the internal surface of the fixing hole 24, and the hook portions 30c are engaged with the lower surface of wall of the printed circuit board 12. Consequently, the fixing pin 30 is substantially immovably held in the fixing hole 24.

In this state, the conducting pins 28 of the connector 14 are in contact with the electrode pads 22 on the printed circuit board 12, and the connector 14 is electrically connected to the printed circuit board 12. Moreover, the connector 14 is mechanically joined to the printed circuit board 12. Accordingly, the fixing pins 30 serve to secure the electrical contact between the conducting pins 28 and the electrode pads 22, and maintain the mechanical connection between the connector 14 and the printed circuit board 12. In other words, the connector 14 is autonomously joined to the printed circuit board 12. Consequently, the connector 14 can be easily attached to and electrically connected with the printed circuit board 12, without using any other jig.

Figure 7:
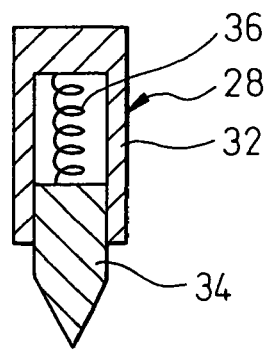
FIG. 7 is a view showing an example of a conducting pin formed as a spring probe.

FIG. 7 is a view showing an example of the conducting pin 28 formed as a spring probe. The conducting pin 28 includes a metallic cylindrical member 32 disposed in the connector body 26, a contact member 34 movably fitted in the metallic cylindrical member 32, and a spring 36 interposed between the metallic cylindrical member 32 and the contact member 34. When the conducting pin 28 is pressed against the electrode pad 22, the probe 34 is brought into contact with the electrode pad 22 under the force exerted by the spring 36. Accordingly, the conducting pin 28 can be securely brought into contact with the electrode pad 22.

After the connector 14 is coupled to the printed circuit board 12, a desired test or the like is carried out. After the test is completed, the connector 14 is detached from the printed circuit board 12.

In order to detach the connector 14 from the printed circuit board 12, the connector 14 is pulled out of the printed circuit board 12 with certain force. This causes the pair of elongated member 30a of the fixing pin 30 to close, and the hook portions 30c are disengaged from the lower surface of the printed circuit board 12. Accordingly, the fixing pins 30 are unlocked, and the connector 14 can be detached from the printed circuit board 12.

In this case, preferably, the hook portions 30c of the fixing pins 30 are devised as follows. That is, when the connector is in use, the conducting pins 28c are in contact with the electrode pads 22, and the hook portions 30c are locked so as not to come off from the fixing holes 24 due to the spring force exerted by the springs 36. In detaching the connector 14 from the printed circuit board 12, the connector 14 is extracted, by applying force, larger than contact pressure between the conducting pins 28 and the electrode pads 22, to the fixing pins 30, thereby extracting the hook portions 30c from the fixing holes 24.

Figure 8:
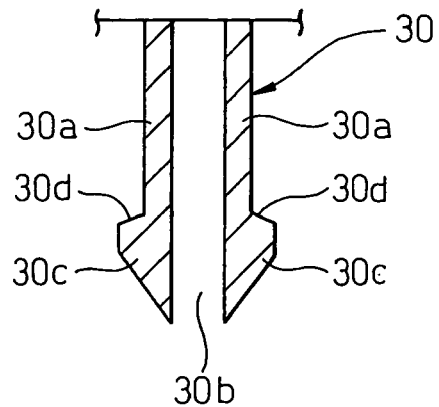
FIG. 8 is a view showing an example of a hook portion of a fixing pin.

For example, as shown in FIG. 8, a part 30d of the hook portions 30c of the fixing pin 30, which is engaged with the lower surface of the printed circuit board 12, is slightly rounded or tilted relative to a plane parallel with the lower surface of the printed circuit board 12.

Figure 9:
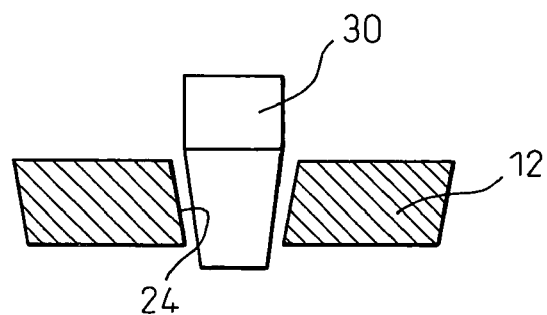
FIG. 9 is a view showing another example of a fixing pin.

FIG. 9 shows another example of the fixing pin 30. The fixing pin 30 is shaped to be thinner towards the distal end thereof, and be thick in the middle portion. When the fixing pin 30 is inserted into the fixing hole 24, the fixing pin 30 stops halfway, and friction arises between the fixing pin 30 and the fixing hole 24. The fixing pin 30 is held immovable in the fixing hole 24 due to the frictional force. Accordingly, when the connector is in use, the fixing pins 30 will not come off from the fixing holes 24 due to the spring force exerted by the springs 36. In detaching the connector 14 from the printed circuit board 12, the connector 14 is extracted from the fixing hole 24, by applying force, larger than contact pressure between the conducting pins 28 and the electrode pads 22, to the fixing pins 30.

The fixing pins 30 and the fixing holes 24 serve as a guiding mechanism for attaching the connector 14 to the printed circuit board 12, and realize the mechanical connection between the connector 14 and the printed circuit board 12. Accordingly, the fixing pins 30 and the fixing holes 24 serve to maintain the electrical contact between the conducting pins 28 and the electrode pads 22.

Figure 10:
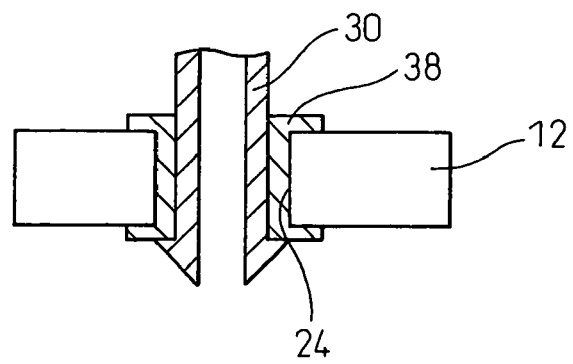
FIG. 10 is a view showing still another example of a fixing pin and a fixing hole.

FIG. 10 shows still another example of the fixing pin 30 and the fixing hole 24. In this example, the fixing hole 24 is formed as a through-hole for use in attaining electrical connection. In other words, a conductive film 38 is formed on the fixing hole 24, and the fixing pin 30 is made of a conductive material. Consequently, the fixing pin 30 is electrically connected to the conductive film 38. In this way, the fixing pin 30 has both the above function of the fixing pin 30 and the function of the conducting pin 28.

Figure 11:
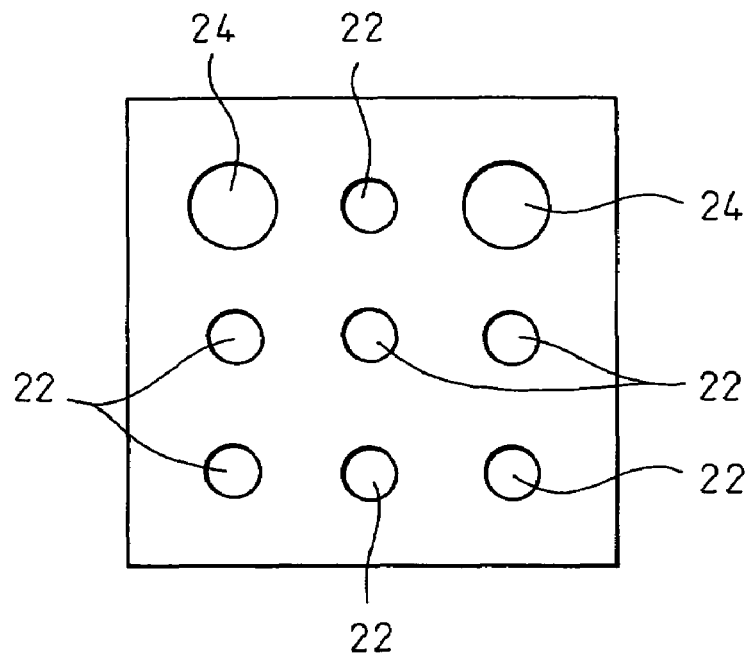
FIG. 11 is a view showing still another example of the arrangement of plural electrode pads and plural fixing holes.

FIG. 11 to FIG. 18 show examples of a structure for restricting a mounting direction of the connector 14. FIG. 11 shows still another example of a layout of plural electrode pads 22 and plural fixing holes 24. While the two fixing holes 24 are arranged symmetrically in a second row in FIG. 2, the two fixing holes 24 are arranged symmetrically at both ends of a first row, respectively in FIG. 11. Accordingly, the two fixing pins 30 are also arranged symmetrically at both ends of the first row, respectively. Alternatively, the two fixing holes 24 can be disposed at both ends of a third row, respectively, or at both ends of a first column or a third column, respectively in a vertical direction. The layout of the two fixing pins 30 can be changed corresponding to this layout.

Figure 12:
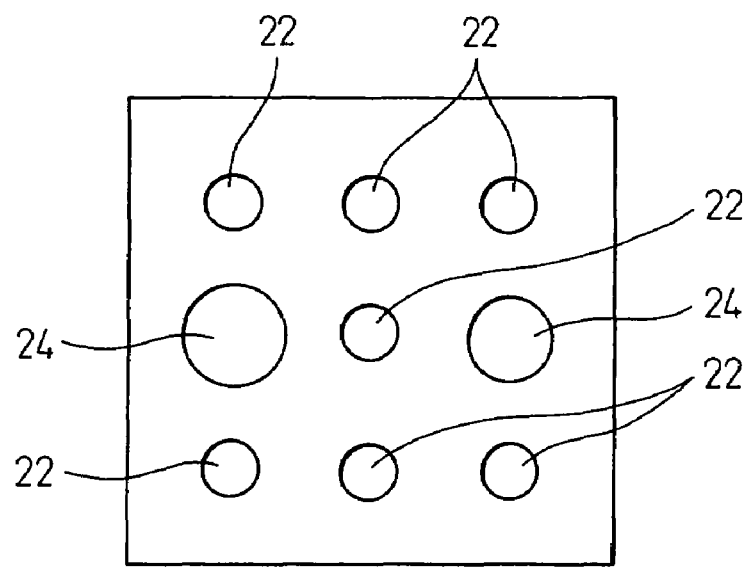
FIG. 12 is a view showing an example of plural fixing holes whose shapes are different from each other.

FIG. 12 shows an example of plural fixing holes 24 whose shapes are different from each other. Sizes (diameters) of the two fixing holes 24 are different from each other. Accordingly, sizes of the two fixing pins 30 are changed to correspond to the sizes of the fixing holes 24.

Figure 13:
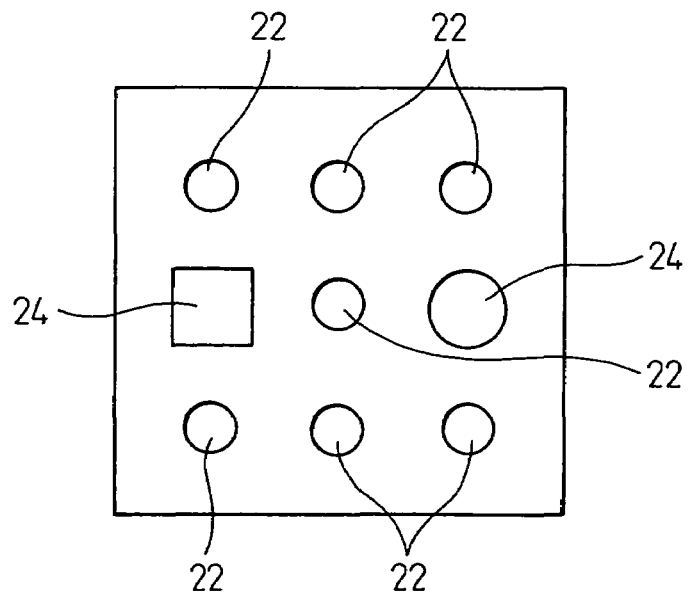
FIG. 13 is a view showing an example of plural fixing holes whose shapes are different from each other.

FIG. 13 shows an example of plural fixing holes 24 whose shapes are different from each other. One of the fixing holes 24 is a square, and the other fixing hole 24 is a circle. Accordingly, shapes of the two fixing pins 30 are changed correspondingly to the shapes of the fixing holes 24.

Figure 14:
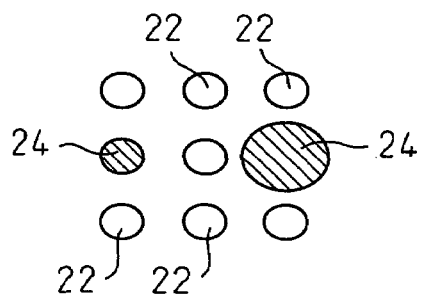
FIG. 14 is a view showing an example of plural fixing holes whose shapes are different from each other.

FIG. 14 shows an example of plural fixing holes 24 whose shapes are different from each other. The two fixing holes 24 are circles, and have different sizes. Accordingly, shapes of the two fixing pins 30 are changed corresponding to the shapes of the fixing holes 24. Incidentally, the shapes of the fixing holes 24 and the fixing pins 30 are not limited to circles or squares.

By changing the respective shapes of the plural fixing holes 24 and the plural fixing pins 30, incorrect insertion can be prevented, and the conducting pins 28 can be accurately brought into contact with the corresponding electrode pads 22.

Figure 15:
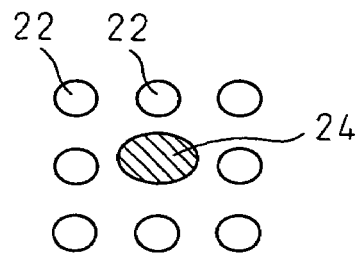
FIG. 15 is a view showing still another example of a layout and shapes of fixing holes.

FIG. 15 shows still another example of a layout of the electrode pads 22 and the fixing hole 24. While the two fixing holes 24 are arranged in FIG. 2, one elliptical fixing hole 24 is disposed at the center in FIG. 15. Accordingly, one fixing pin 30 is formed elliptically.

Figure 16:
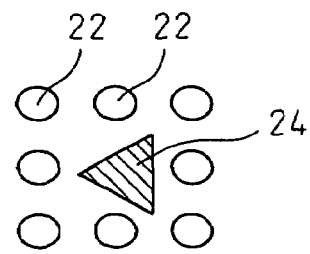
FIG. 16 is a view showing still another example of a layout and shapes of fixing holes.
Figure 17:
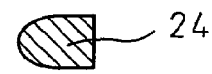
FIG. 17 is a view showing still another example of a shape of a fixing hole.

FIG. 16 shows an example of the fixing hole 24 whose shape is changed. One triangular fixing hole 24 is disposed at the center. Accordingly, one fixing pin 30 is formed triangularly corresponding to this shape. In FIG. 17, one fixing hole 24 is shaped in a bullet form. In this case, the fixing pin 30 is shaped in a bullet form accordingly.

As explained above, one fixing hole 24 and one fixing pin 30 are used to fix the connector 4 to the printed circuit board 12. By changing the shapes of the fixing hole 24 and the fixing pin 30, incorrect insertion can be prevented, and the conducting pins 28 can be accurately brought into contact with the corresponding electrode pads 22.

Figure 18:
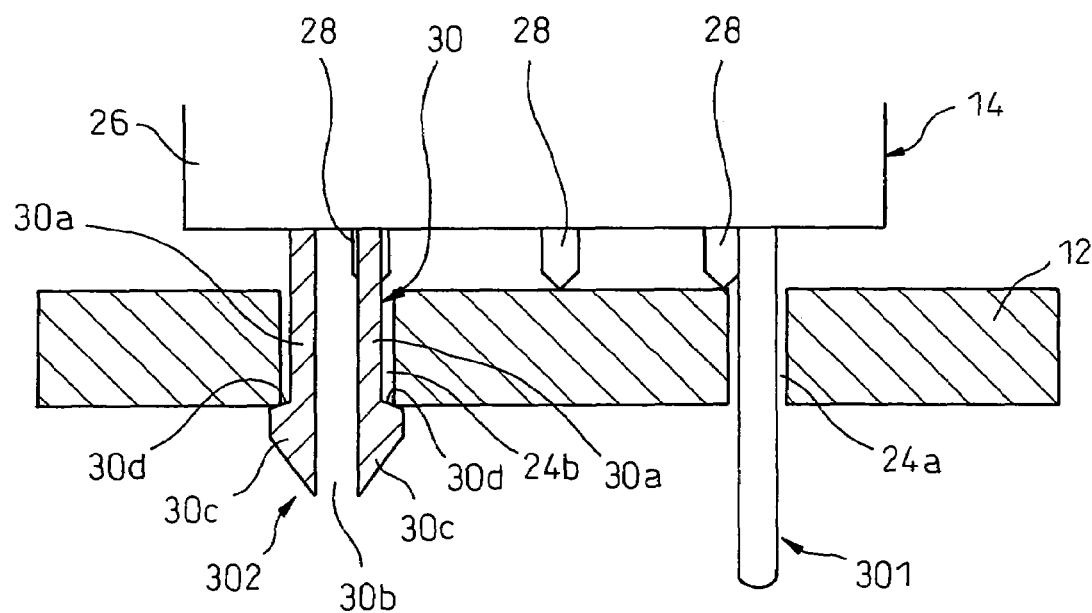
FIG. 18 is a view showing still another example in which lengths, sizes of cross sections, and shapes of two fixing pins, respectively are changed.

FIG. 18 shows an example in which lengths, sizes of cross sections, and shapes of two fixing pins 301 and 302 at the connector 14 side, respectively are changed. On the printed circuit board 12, two fixing holes 24 are formed at both sides of the printed circuit board 12, like in the example shown in FIG. 12, and a cross-sectional diameter of one of the fixing holes 24a is set smaller than the cross-sectional diameter of the other fixing hole 24b.

On the other hand, at the connector 14 side, the fixing pin 301 has a larger size and a smaller cross section than the size and the cross section of the fixing pin 302, respectively. The fixing pin 302 30 has a split structure at a distal end, like the fixing pin shown in FIG. 8, and is formed with the pair of elongated members 30a that are elastically deformable to move toward and away from each other. The gap 30b is formed between the pair of the elongated members 30a. Each elongated member 30a has the arrowhead-like hook portion 30c at a distal end thereof.

According to this structure, the two fixing pins are not simultaneously inserted into the fixing holes, but the fixing pin 301 having a larger length and a smaller thickness is first inserted into the corresponding fixing hole 24a. With this fixing hole 24a used as a guiding hole, the fixing pin 302 having a smaller length and a larger thickness is inserted into the corresponding fixing hole 24b. When the hook portion 30c of the fixing pin 302 is engaged with the surface at the opposite side of the fixing hole 4b, the connector 14 is positioned and fixed to the printed circuit board 12. In this embodiment, the fixing pin 302 is inserted into the corresponding fixing hole 24b, by using the long and thin fixing pin 301 that can be inserted easily and the corresponding fixing hole 24a, as guides. Therefore, the connector can be inserted and positioned easily.

FIG. 19 shows an example of a layout of the electrode pads 22 suitable for standardizing or unifying the layout of the electrode pads 22 for the five signals TDI, TDO, TMS, TCK, and TRST and the two grounding (GND) electrode pads 22 shown in FIG. 2 to realize the JTAG test.

A test region of the printed circuit board to which the testing connector is to be connected is set as a square region of 5.00 mm times 5.00 mm, for example, and a TCK electrode pad is disposed at the center of this region. A square having 2.54 mm in each side is prescribed around this center position. A TDI electrode pad and a TDO electrode pad are disposed at both ends of one diagonal line, respectively. A TMS electrode pad and a TRST electrode pad are disposed at both ends of the other diagonal line, respectively. One ground (GND) electrode pad is disposed at a center position of a first side (i.e., a first row) of this square, and another ground electrode pad is disposed at a center position of a third side of this square (i.e., a third row) opposite to the first side. Each of these electrode pads 22 has a diameter 0.6 mm. When these electrode pads 22 are disposed in this way, the arrangement of wiring on the printed circuit board connected to the electrode pads 22 can be optimized.

The two fixing holes 24 are disposed on a straight line (i.e., a second row) between the first side (i.e., the first row) and the third side (i.e., the third row) of the square of which one side is 2.54 mm, at positions separated by an equal distance 1.50 mm from the center of the straight line in mutually opposite directions, respectively. Each of these fixing holes 24 has a diameter 1.00 mm.

As described above, it is ideal that the electrode pads 22 and the fixing holes 24 are laid out symmetrically in a vertical direction and a lateral direction, and this layout is suitable for standardization or unification. It is needless to mention that sizes or layouts of the conducting pins 28 and the fixing pins 30 at the connector 14 side are set corresponding to the sizes and layouts of the electrode pads 22 and the fixing holes 24 at the printed circuit board 12 side.

INDUSTRIAL APPLICABILITY

As explained above, according to the present invention, a connector and electrode pads corresponding to the connector are disposed; the connector has conducting pins that function as probes, and fixing pins that secure a contact between the conducting pins and electrode pads and that maintain a mechanical coupling. With this arrangement, an additional jig that connects between a printed circuit board and a test device is not necessary. Further, a development expense and a manufacturing expense of such a jig can be decreased. The connector can be autonomously connected to the printed circuit board, thereby achieving a secure electrical connection. Therefore, when the connector is used in a state of being connected to the test device, the printed circuit board (or a semiconductor element mounted on the printed circuit board) can be tested at low cost. In addition to the electrode pad for testing, only fixing holes are provided on the printed circuit board. Therefore, there is substantially no cost increase. Because the fixing holes and the conducting pins are collectively disposed in one region, an additional area is not necessary, and the layout of the conducting pins and the electrode pads has a degree of freedom. Further, because the layout of the conducting pins, the electrode pads, the fixing pins, and the fixing holes is constant, the layout combination is suitable for standardization for the JTACT tests.

What is claimed is:

1. A connector arranged to be connected to a test region of a printed circuit board on which at least one fixing hole and a plurality of signal electrodes are disposed, the connector comprising: a connector body; at least one fixing pin arranged to be inserted into the fixing hole; and a plurality of signal conducting pins arranged to contact the signal electrodes, the at least one fixing pin and the plurality of signal conducting pins being protruded in parallel with each other from the connector body, wherein the fixing pin is longer than the conducting pin;

five signal conducting pins are disposed at each apex of a square and at a center position of diagonal lines of the square, respectively; and wherein two fixing pins are disposed on a straight line between a first side and a third side of the square, at positions separated from the center positions of the diagonal lines in mutually opposite directions, respectively.

2. The connector according to claim 1, wherein the at least one fixing pin comprises at least one elastically deformable member, and the member has a hook portion.

3. The connector according to claim 1, wherein the at least one fixing pin has a tapered shape thinner toward a distal end thereof.

4. The connector according to claim 1, wherein the at least one fixing pin is structured to restrict a direction of mounting the connector.

5. The connector according to claim 1, wherein the at least one fixing pin includes two fixing pins.

* * * * *